(12) United States Patent
Yoshida

(10) Patent No.: US 10,699,870 B2
(45) Date of Patent: Jun. 30, 2020

(54) SAMPLE CARRIER AND ELECTRON MICROSCOPE

(71) Applicant: JEOL Ltd., Tokyo (JP)

(72) Inventor: Shuho Yoshida, Tokyo (JP)

(73) Assignee: JEOL Ltd., Tokyo (JP)

(*) Notice: Subject to any disclaimer, the term of this patent is extended or adjusted under 35 U.S.C. 154(b) by 0 days.

(21) Appl. No.: 16/531,697

(22) Filed: Aug. 5, 2019

(65) Prior Publication Data
US 2020/0051775 A1    Feb. 13, 2020

(30) Foreign Application Priority Data

Aug. 9, 2018 (JP) .................................. 2018-150487

(51) Int. Cl.
*H01J 37/20* (2006.01)
*H01J 37/18* (2006.01)
*H01J 37/26* (2006.01)

(52) U.S. Cl.
CPC ............ *H01J 37/20* (2013.01); *H01J 37/185* (2013.01); *H01J 37/26* (2013.01); *H01J 2237/20228* (2013.01); *H01J 2237/20278* (2013.01)

(58) Field of Classification Search
CPC .......... H01J 37/20; H01J 37/26; H01J 37/185; H01J 2237/184; H01J 2237/2007;
(Continued)

(56) References Cited

U.S. PATENT DOCUMENTS 6,410,925 B1 * 6/2002 Armbruster ............. H01J 37/20
250/442.11
8,710,439 B2 * 4/2014 Ominami ................ H01J 37/18
250/306
(Continued)

FOREIGN PATENT DOCUMENTS

JP    2004165579 A *  6/2004
JP    2004165579 A    6/2004
JP    2006313651 A   11/2006

OTHER PUBLICATIONS

Leica Microsystems Gmbh, Leica EM VCT100 Vacuum Cryo Transfer From Preparation to Analysis, May 2009, pp. 1-12; https://www.leica-microsystems.com/fileadmin/downloads/Leica%20EM%20VCT100/Brochures/Leica_EMVCT100_Brochure_EN.pdf.
(Continued)

*Primary Examiner* — Wyatt A Stoffa
(74) *Attorney, Agent, or Firm* — The Webb Law Firm

(57) ABSTRACT

A sample carrier capable of preventing damage to a support stage on which a sample holder is placed while ensuring a sufficient level of conveyance speed includes a sample holder, a holder mounting member, and a transport portion. The transport portion has a drive source (constant-speed motor), a rotary member (second toothed wheel), a guide portion (linear guide), and a rod. The rotary member is rotated about its axis of rotation by the drive source. The guide portion operates to guide the holder mounting member in a linear direction perpendicular to the axis of rotation of the rotary member. The rod is rotatably coupled to the rotary member and to the holder mounting member and has a coupled portion coupled to the rotary member. At a midpoint of the range of movement of the holder mounting member, the shortest distance from the coupled portion to the guide portion is greatest.

5 Claims, 10 Drawing Sheets

(58) Field of Classification Search
CPC ... H01J 2237/20221; H01J 2237/20228; H01J 2237/20278
See application file for complete search history.

(56) References Cited

U.S. PATENT DOCUMENTS

| | | | | |
|---|---|---|---|---|
| 9,012,841 | B2* | 4/2015 | Heyoung | H01J 37/20 250/307 |
| 9,099,281 | B2* | 8/2015 | Yaguchi | G01N 23/2251 |
| 9,875,878 | B2* | 1/2018 | Nakayama | G01N 23/2204 |
| 10,103,001 | B2* | 10/2018 | Han | H01J 37/20 |
| 2002/0005492 | A1* | 1/2002 | Hashikawa | H01J 37/20 250/442.11 |
| 2002/0166976 | A1* | 11/2002 | Sugaya | H01L 21/68707 250/440.11 |
| 2014/0175278 | A1* | 6/2014 | Ominami | H01J 37/244 250/310 |
| 2016/0163508 | A1* | 6/2016 | Iwaya | H01J 37/304 204/192.33 |

OTHER PUBLICATIONS

Extended European Search Report issued in EP 19191083.5 dated Jan. 7, 2020.

* cited by examiner

SAMPLE CARRIER AND ELECTRON MICROSCOPE

CROSS-REFERENCE TO RELATED APPLICATION

This application claims priority to Japanese Patent Application No. 2018-150487 filed Aug. 9, 2018, the disclosure of which is hereby incorporated by reference in its entirety.

BACKGROUND OF THE INVENTION

Field of the Invention

The present invention relates to a sample carrier for transporting a sample and also to an electron microscope equipped with this sample carrier.

Description of Related Art

In electron microscopy, a sample to be observed or analyzed is generally held by a sample holder. The sample holder holding the sample thereon is transported into the sample chamber of the electron microscope by a transport device or mechanism. One example of the device for transporting the sample is described, for example, in JP-A-2004-165579, which sets forth a vacuum transport device for use with vacuum processing equipment. The vacuum transport device operates to transport a sample into and out of a vacuum processing chamber that is used for fabrication steps (such as processing and inspection) for substrates of semiconductor fabrication equipment, flat panel displays, crystals, storage devices, or the like.

In the vacuum transport device set forth in JP-A-2004-165579, rotary power is transmitted from a rotary drive source 5 on the atmospheric side 3 to a buffer chamber 2 on the vacuum side and thence to plural stages of linear guides 6, 7 through a direction-converting, non-contacting power transmission means 8 to stretch and contract the linear guides 6 and 7. When the linear guides are stretched, a hand 40 on the linear guide 7 is entered into a vacuum processing chamber 1, and a sample W is handed over.

In the vacuum transport device set forth in JP-A-2004-165579, the linear guides 6 and 7 are stretched and contracted at a constant speed. Therefore, when the hand 40 hands over the sample W to a sample processing section 1b within the vacuum processing chamber 1, contact between the hand 40 and the sample processing section 1b may cause damage to the sample processing section 1b. When the sample W is handed over, if the linear guides 6 and 7 are stretched and contracted at a lower speed to prevent the sample processing section 1b from being damaged, it is necessary to have a control system that provides variable speeds of the linear guides 6 and 7.

SUMMARY OF THE INVENTION

Accordingly, it is an object of the present invention to provide a sample carrier capable of protecting a support stage for a sample holder from being damaged without using a control system providing variable speeds, as well as an electron microscope equipped with this sample carrier.

This object is achieved in accordance with the teachings of the present invention by a sample carrier comprising: a sample holder for holding a sample; a holder mounting member configured to be capable of being attached and detached to and from the sample holder and having a range of movement; and a transport portion for causing the holder mounting member to move rectilinearly. The transport portion has: a drive source; a rotary member rotated about its axis of rotation by the drive source; a guide portion for guiding the holder mounting member in a linear direction perpendicular to the axis of rotation of the rotary member; and a rod rotatably coupled to the rotary member and to the holder mounting member and having a coupled portion coupled to the rotary member. At a midpoint of the range of movement of the holder mounting member, the shortest distance from the coupled portion of the rod to the guide portion is greatest. The holder mounting member has a cylindrically shaped connective portion, a base portion fitted over the connective portion, and a biasing portion for biasing the connective portion toward the sample holder. The connective portion has an outer peripheral portion on which an engagement piece is mounted. The connective portion is supported by the base portion so as to be rotatable about its axis and movable axially. One of the base portion and the connective portion has a cam groove, while the other has cam pins that engage the cam groove. When the base portion moves relative to the connective portion axially of the connective portion, the cam pins and the cam groove cooperate to rotate the connective portion through a given angle in one directional direction, whereby the engagement piece is placed either in an engagement position where the engagement piece engages the sample holder or a non-engagement position where the engagement piece disengages from the sample holder.

An electron microscope according to the present invention which achieves the above object has: an electron beam irradiation portion for irradiating a sample with an electron beam; an electron detection device for detecting electrons emanating from the sample in response to the electron beam irradiation; and the above-described sample carrier for transporting the sample into a position hit by the electron beam.

According to the present invention, when the holder mounting member moves from the midpoint of the range of movement to its end, the sample holder decreases in speed and, therefore, the support stage for the sample holder can be prevented from being damaged without using a control system for providing variable speeds.

DESCRIPTION OF THE INVENTION

Figure 1:
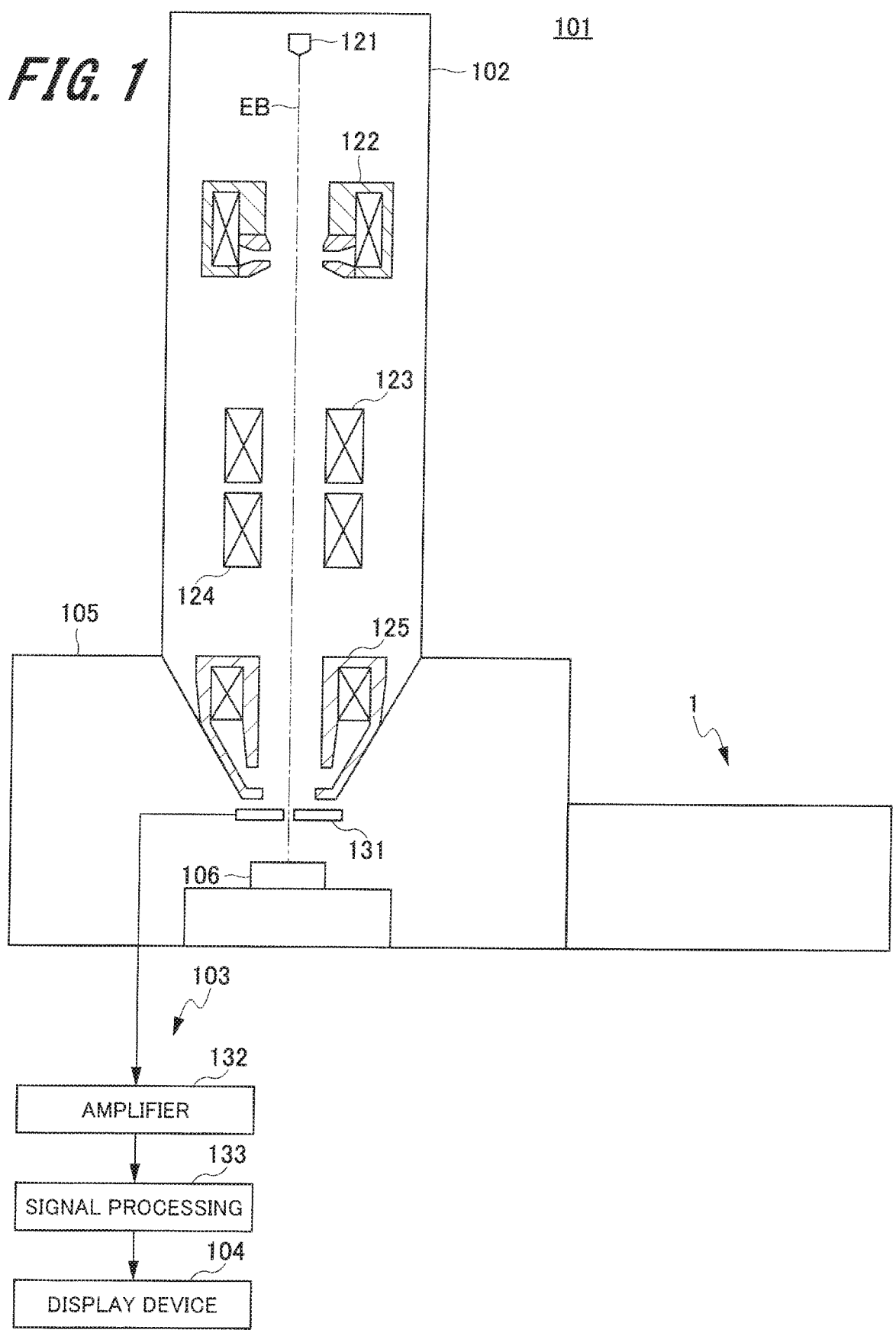
FIG. 1 is a schematic vertical cross-sectional view, partly in block form, of an electron microscope associated with one embodiment of the present invention.

The preferred and best modes for practicing the present invention (hereinafter referred to as the embodiments) are hereinafter described in detail with reference to the drawings. It is to be understood that the invention is not restricted to the embodiments given below and that various numerical values used in the embodiments are merely exemplary. Throughout the present specification and accompanying drawings, identical components or components having substantially identical functions are indicated by identical reference numerals and a repetition of the description thereof is omitted.

Scanning Electron Microscope

Before the sample carrier of the present invention is described, an inventive electron microscope equipped with this sample carrier is described. A scanning electron microscope (SEM) is herein taken as one example of the electron microscope of the present invention.

FIG. 1 is a schematic diagram of the electron microscope of the present invention. As shown in FIG. 1, the scanning electron microscope, 101, includes at least an electron beam irradiation portion 102, an electron detection device 103, a display device 104, and a sample carrier 1. The electron beam irradiation portion 102 emits a primary electron beam EB at a sample 106 disposed within a sample chamber 105. As a result, secondary electrons and backscattered electrons are released from the sample 106. The secondary electrons are emitted by excitation of atoms in the surface of the sample 106. Electrons impinging on the sample 106 bounce off the sample surface, resulting in the backscattered electrons.

The electron beam irradiation portion 102 is configured including an electron gun 121, condenser lenses 122, a deflector 123 for X-direction scan, a deflector 124 for Y-direction scan, and an objective lens 125. The electron gun 121 emits the thin electron beam EB, called an electron probe. The condenser lenses 122 are used to adjust the diameter of the electron beam EB emitted from the electron gun 121, and are made, for example, of magnetic or electromagnetic lenses utilizing the action of magnets or electromagnets.

The deflector 123 for X-direction scan is used such that the electron beam EB to be directed at the sample 106 is scanned in the X-direction (left-and-right direction as viewed in FIG. 1). The deflector 124 for Y-direction scan is used such that the electron beam EB to be directed at the sample 106 is scanned in the Y-direction perpendicular to the plane of the paper. The electron beam EB emitted from the electron gun 121 is scanned in two dimensions by these deflectors 123 and 124. The objective lens 125 is used for a focusing operation that determines the final diameter of the electron beam EB impinging on the sample 106, and is made, for example, of magnetic lenses in the same way as for the condenser lenses 122.

The electron detection device 103 detects the backscattered electrons released from the sample 106 when the sample 106 is irradiated with the electron beam EB, and performs processing to generate a compositional signal for creating a compositional BSE (backscattered electron) image based on information about the detected backscattered electrons and to display the compositional BSE image (hereinafter may be simply referred to as the compositional image) on the display device 104.

The electron detection device 103 is equipped with a plurality of detectors 131 for detecting the electrons released from the sample 106 (more specifically, backscattered electrons) in response to the electron beam directed at the sample 106 by the electron beam irradiation portion 102. The detectors 131 are made, for example, of semiconductor backscattered electron detectors which detect, on a pixel-by-pixel basis, the backscattered electrons emitted from the sample 106 in response to the electron beam scanned in two dimensions. The detectors 131 are mounted opposite to the sample 106 on the underside of the objective lens 125. A well-known quadrant backscattered electron detection device is used as the detectors 131 of the electron detection device 103 associated with the present embodiment.

Although a quadrant BSE detector is herein exemplified as the plural detectors 131, they are not restricted to a quadrant BSE detector. That is, any detector having detection segments arranged radially about the center of the whole detection area can be used as the plural detectors 131.

The electron detection device 103 includes an amplifier 132 and signal processing circuitry 133, in addition to the detectors 131 for detecting backscattered electrons. When the electron beam EB (electron probe) is scanned, the detectors 131 provide output detection signals of levels corresponding to the amounts of backscattered electrons detected for the individual pixels scanned. The amplifier 132 amplifies the output detection signals produced for the individual pixels scanned, and supplies the amplified signals to the signal processing circuitry 133.

The signal processing circuitry 133 is a digital signal processing section that has the functions of a tilt information acquisition portion, a correction processing portion, and an imaging portion, and generates a compositional signal based on the detection signals supplied from the amplifier 132. The compositional signal from the signal processing circuitry 133 is fed to the display device 104. The signal processing circuitry 133 can be implemented by a microcomputer having a processor that interprets programs for realizing the functions and implements the functions in software.

The display device 104 is made of a liquid crystal display or the like and provides a display of a compositional BSE image based on the compositional signal generated by the electron detection device 103. The scanning electron microscope 101 permits one to check a compositional distribution in the sample 106 from the compositional BSE image displayed on the display device 104.

Sample Carrier

Figure 2:
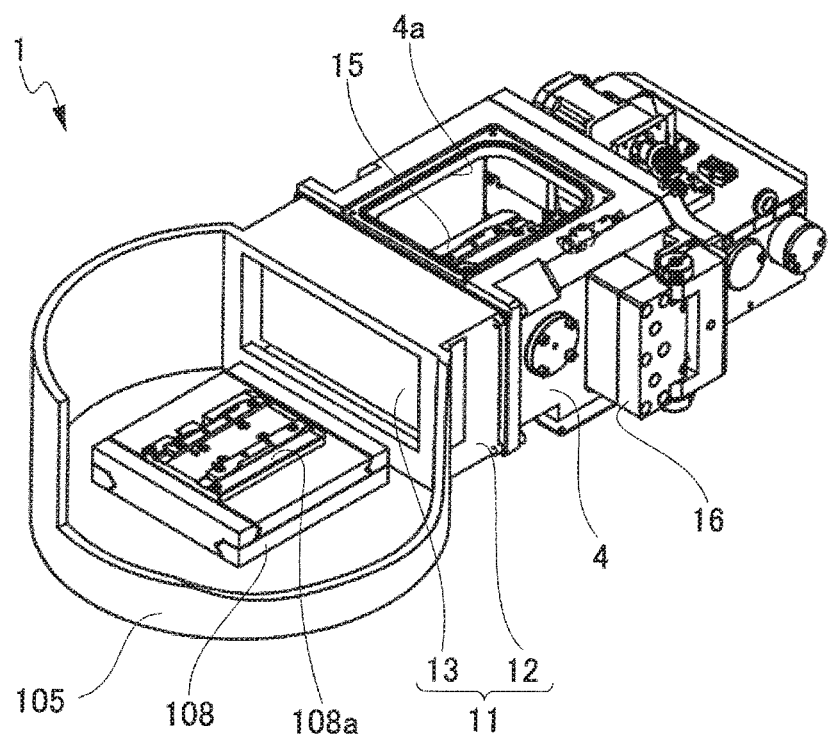
FIG. 2 is a perspective view of the sample carrier shown in FIG. 1.
Figure 3:
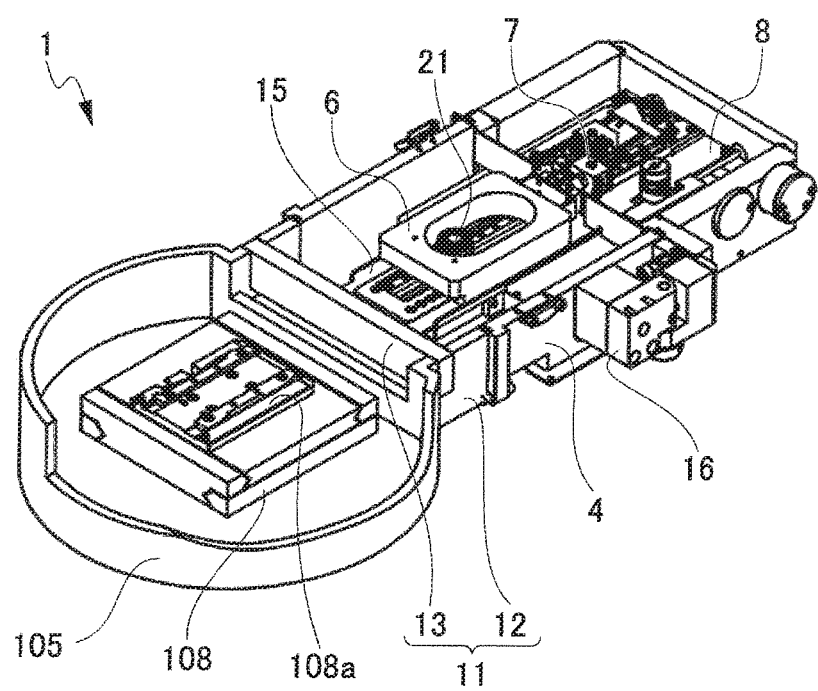
FIG. 3 is a perspective view similar to FIG. 2, but showing a state in which the sample carrier has been cut horizontally.

The configuration of the sample carrier 1 is next described by referring to FIGS. 2 and 3. FIG. 2 is a perspective view of the sample carrier 1. FIG. 3 is a cross-sectional view taken horizontally through the sample carrier 1.

As shown in FIGS. 2 and 3, the sample carrier 1 has a sample exchange chamber 4, a sample holder 6 moved into and out of the sample exchange chamber 4, a holder mounting member 7 detachably attached to the sample holder 6, and a transport portion 8 for causing the holder mounting member 7 to move rectilinearly.

In the sample exchange chamber 4, the sample carrier 1 transports the sample holder 6 mounted on the holder mounting member 7 into the sample chamber 105 by means of the transport portion 8. The holder mounting member 7 is mounted on the sample holder 6 that is disposed in the sample chamber 105, and the sample holder 6 is carried into the sample exchange chamber 4.

Sample Exchange Chamber

The sample exchange chamber 4 is coupled to the sample chamber 105 via a valve assembly 11. The valve assembly 11 has a valve box 12 and a valve body or casing 13 configured to open and close the valve box 12 that forms a passage between the sample exchange chamber 4 and the sample chamber 105. When the valve box 12 is closed off by the valve body 13, the valve assembly 11 is closed. Under this condition, the communication between the sample exchange chamber 4 and the sample chamber 105 is blocked. On the other hand, when the valve body 13 is moved to a position where the valve box 12 is opened, the valve assembly 11 is opened. Under this condition, the sample exchange chamber 4 and the sample chamber 105 are placed in communication with each other.

The sample chamber 105 shown in FIGS. 2 and 3 is shown party cutaway to facilitate understanding the interior condition. A support stage 108 that supports the sample holder 6 is disposed inside the sample chamber 105. A holder connecting portion 108a to which a lower part of the sample holder 6 is removably coupled is mounted on the top surface of the support stage 108.

The sample exchange chamber 4 is a hollow enclosure and has at its top a window 4a for exchange, as shown in FIG. 2. The exchange window 4a is opened and closed by an exchange cover (not shown). The sample holder 6 is transported into the sample exchange chamber 4 through the exchange window 4a and carried outwardly through the exchange window 4a. A holder guide 15 for guiding the movement of the sample holder 6 and a vacuum pump 16 are mounted inside the sample exchange chamber 4.

The holder guide 15 is disposed in the sample exchange chamber 4. The lower part of the sample holder 6 slidably engages the holder guide 15. The vacuum pump 16 is mounted to a side surface of the sample exchange chamber 4. The sample chamber 105 is kept in vacuum. When the sample holder 6 (and thus the sample 106) is transported into the sample chamber 105, the sample exchange chamber 4 is evacuated using the vacuum pump 16 and then the valve assembly 11 is opened.

Sample Holder

The sample holder 6 is shaped substantially in the form of a rectangular parallelepiped and has a sample holding portion 21 at its top surface. The top surface of the sample holder 6 has a holding plate engagement portion to which a sample holding plate (not shown) can be detachably attached. That is, the sample holder 6 can hold the sample 106 via the sample holding plate.

Figure 13:
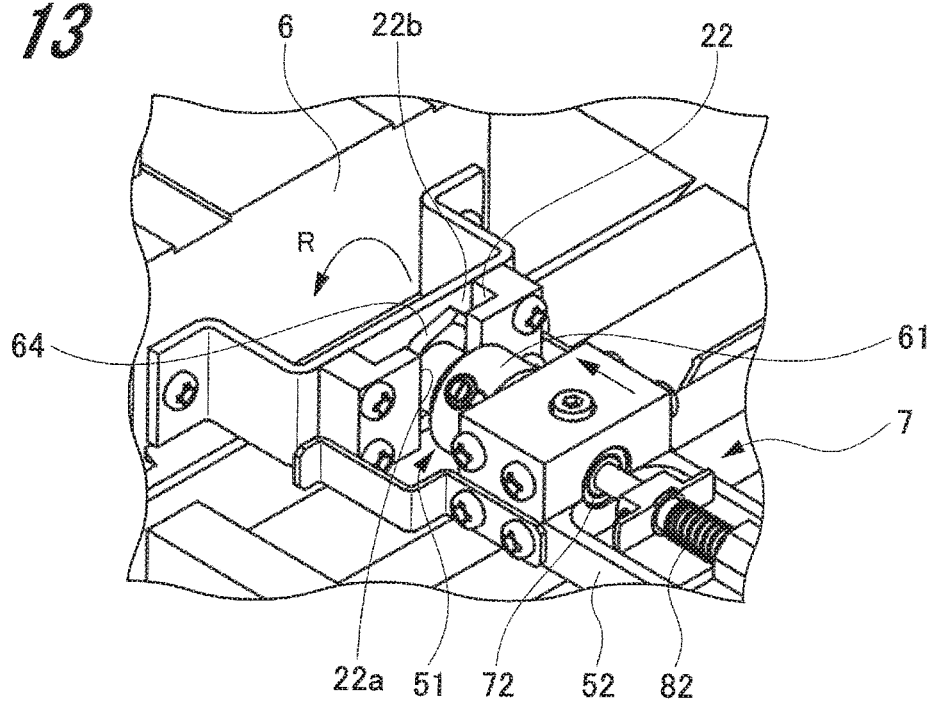
FIG. 13 is an explanatory view of the holder mounting member, illustrating a state in which the sample holder of the sample carrier has been transported onto a support stage.

The surface of the sample holder 6 on the opposite side from the sample chamber 105 is formed with an engagement groove 22 in which the holder mounting member 7 is engaged, as shown in FIG. 13. The engagement groove 22 assumes a substantially T-shaped form as viewed from above, and has an opening 22a and a bottom surface 22b. The opening 22a of the engagement groove 22 is narrower in width than the bottom surface 22b.

Configuration of Transport Portion

The configuration of the transport portion 8 is next described by referring to FIGS. 4-8.

Figure 4:
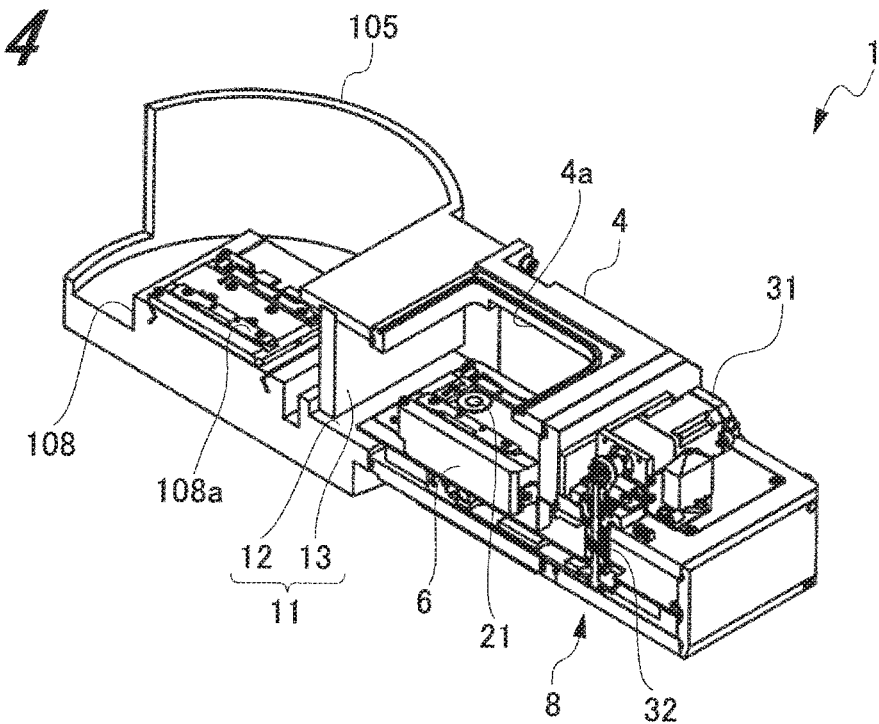
FIG. 4 is a perspective view similar to FIG. 2, but showing a state in which the sample carrier has been cut vertically.
Figure 5:
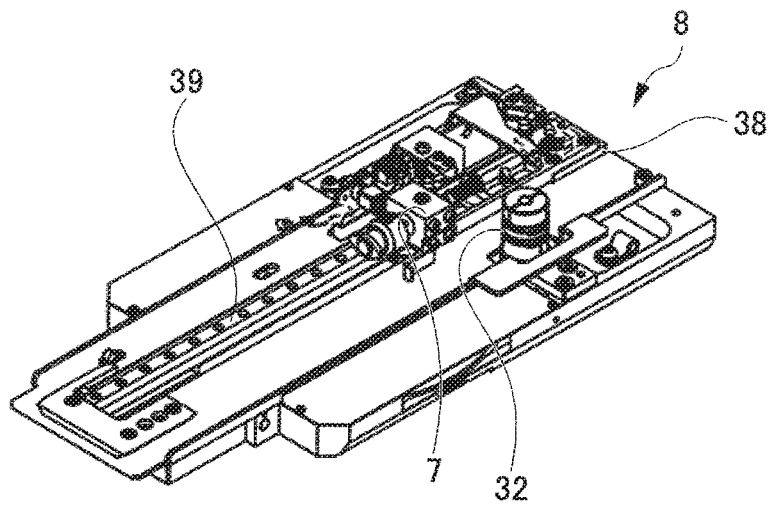
FIG. 5 is an explanatory view of a coupling of the sample carrier of FIGS. 2-4.
Figure 6:
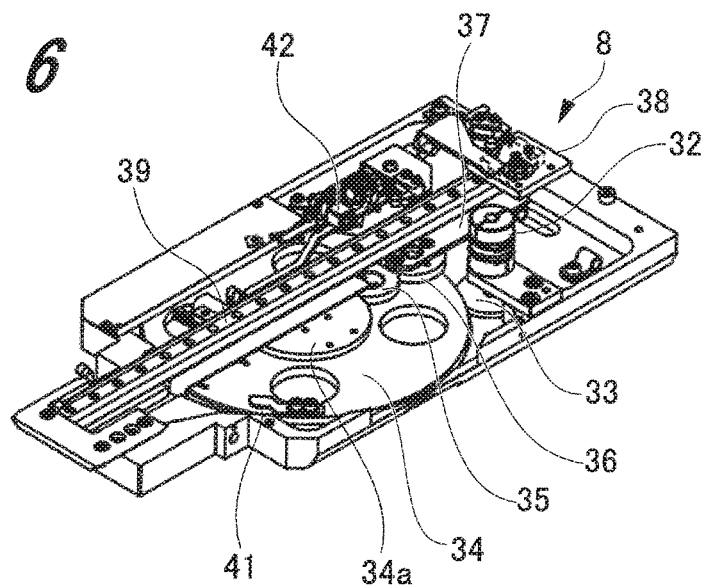
FIG. 6 is a perspective view of a transport portion of the sample carrier of FIGS. 2-5.
Figure 7:
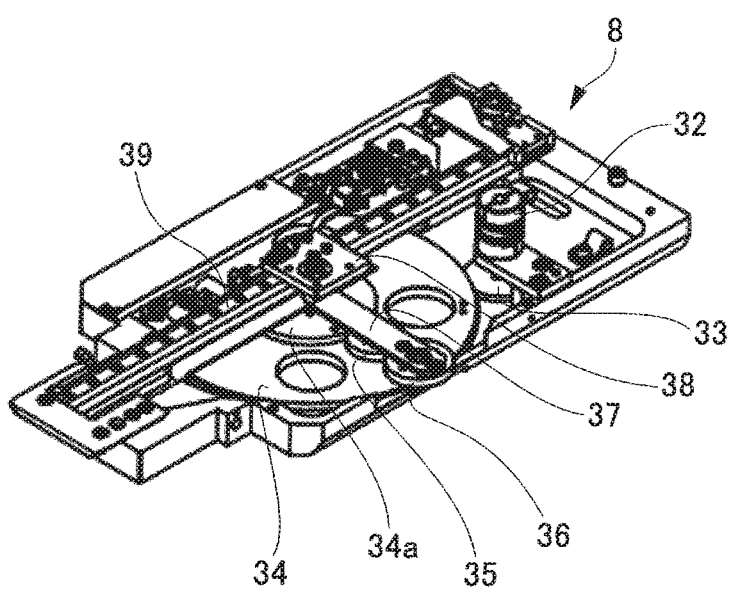
FIG. 7 is a perspective view similar to FIG. 6, but showing a state in which the holder mounting member of the sample carrier of FIGS. 2-5 has been moved to a midpoint of the range of movement of the holder mounting member.
Figure 8:
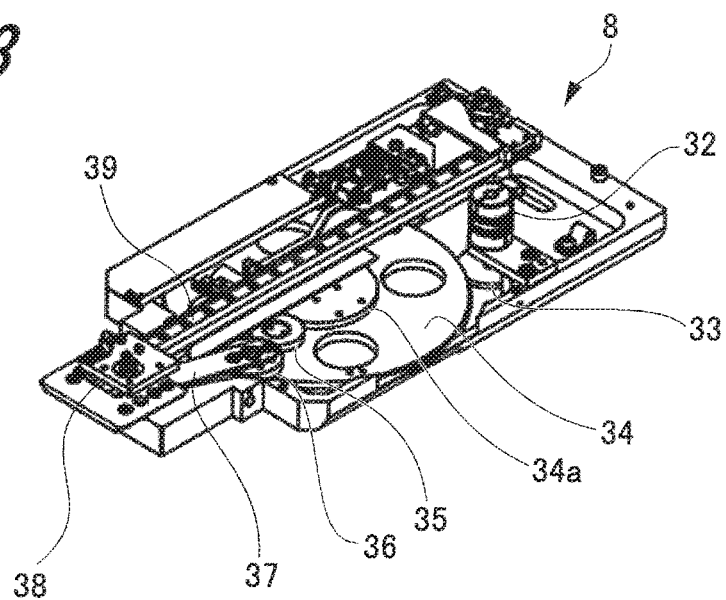
FIG. 8 is a perspective view similar to FIG. 6, but showing a state in which the holder mounting member of the sample carrier of FIGS. 2-5 has been moved to an end of the range of movement of the holder mounting member.

FIG. 4 shows a state in which the sample carrier 1 is cut vertically. FIG. 5 illustrates a coupling of the sample carrier 1. FIG. 6 is a perspective view of the transport portion 8. FIG. 7 shows a state in which the holder mounting member 7 has been carried to the midpoint of its range of movement. FIG. 8 shows a state in which the holder mounting member 7 has been carried to an end of the range of movement.

As shown in FIGS. 4-8, the transport portion 8 has a constant-speed motor 31 being one specific example of a drive source associated with the present invention, a coupling 32, a first toothed wheel 33, a second toothed wheel 34, a third toothed wheel 35, a fourth toothed wheel 36, a rod 37, a slider 38, and a linear guide 39. The transport portion 8 produces rectilinear motion of the holder mounting member 7.

As shown in FIG. 4, the constant-speed motor 31 is fixedly secured to the outside of the sample exchange chamber 4. The coupling 32 extends through an upper wall portion of the sample exchange chamber 4. The coupling 32 couples together the drive shaft of the constant-speed motor 31 disposed outside the sample exchange chamber 4 and the first toothed wheel 33 disposed inside the sample exchange chamber 4. Accordingly, the torque of the constant-speed motor 31 is transmitted to the first toothed wheel 33 via the coupling 32.

As shown in FIG. 6, the first toothed wheel 33, second toothed wheel 34, third toothed wheel 35, and fourth toothed wheel 36 are disposed inside the sample exchange chamber 4. These toothed wheels rotate about their respective axes parallel to an up and down direction. The first toothed wheel 33 is in mesh with the second toothed wheel 34. The second toothed wheel 34 is one specific example of a rotary member associated with the present invention. The second toothed wheel 34 has the greatest diameter out of the four toothed wheels. A fixed toothed wheel 34a is formed on the top surface of the second toothed wheel 34. The center of the fixed toothed wheel 34a is coincident with the center of rotation of the second toothed wheel 34.

A switch actuator 41 being one specific example of a detected portion associated with the present invention is mounted on the top surface of the second toothed wheel 34.

A detection switch 42 being one specific example of a detection portion associated with the present invention is disposed above the second toothed wheel 34. The detection switch 42 detects that the holder mounting member 7 is placed at one end of its range of movement by being pushed by the switch actuator 41.

The third toothed wheel 35 is rotatably supported to the second toothed wheel 34 and in mesh with the fixed toothed wheel 34*a* on the second toothed wheel 34. Similarly, the fourth toothed wheel 36 is rotatably supported to the second toothed wheel 34 and in mesh with the third toothed wheel 35.

The rod 37 is shaped as a substantially rectangular plate and has one longitudinal end firmly fixed to the fourth toothed wheel 36. Therefore, the rod 37 is rotatably coupled to the second toothed wheel 34 via the fourth toothed wheel 36. The other longitudinal end of the rod 37 is rotatably coupled to the slider 38. The one longitudinal end of the rod 37 may hereinafter be referred to simply as "one end of the rod 37", while the other longitudinal end of the rod 37 may be referred to simply as "the other end of the rod 37".

The slider 38 is in slidable engagement with the linear guide 39 and moves along the linear guide 39. The holder mounting member 7 is held to the slider 38. The longitudinal direction of the linear guide 39 is perpendicular to the axis of rotation of the second toothed wheel 34, and links together the sample exchange chamber 4 and the sample chamber 105.

The distance from the center of rotation of the second toothed wheel 34 to the center of rotation of the fourth toothed wheel 36 (i.e., the center of rotation at the one end of the rod 37) is substantially equal to the distance from the center of rotation of the fourth toothed wheel 36 (i.e., the center of rotation of the one end of the rod 37) to the center of rotation at the other end of the rod 37. The range of movement of the slider 38, i.e., the distance over which the sample holder 6 is conveyed, is set to approximately four times the distance from the center of rotation of the second toothed wheel 34 to the center of rotation of the fourth toothed wheel 36 (the center of rotation at the one end of the rod 37).

When the slider 38 is placed at one end of the range of movement as shown in FIG. 8, a part of the holder mounting member 7 fixedly secured to the slider 38 is within the sample chamber 105. The sample holder 6 mounted to the holder mounting member 7 is placed on the support stage 108 of the sample chamber 105.

When the slider 38 is placed at the other end of the range of movement as shown in FIG. 6, the holder mounting member 7 fixedly secured to the slider 38 is at the farthest position from the sample chamber 105. The holder mounting member 7 and the sample holder 6 mounted to the holder mounting member 7 are disposed inside the sample exchange chamber 4. That is, the transport portion 8 carries the sample holder 6 reciprocatively between the sample exchange chamber 4 and the sample chamber 105.

Operation of Transport Portion

The operation of the transport portion 8 is next described. When the slider 38 is placed at the other end of the range of movement as shown in FIG. 6, the longitudinal direction of the rod 37 is nearly parallel to the linear guide 39, and the one end of the rod 37 (i.e., the fourth toothed wheel 36) is located close to the linear guide 39. Under this condition, if the drive shaft of the constant-speed motor 31 rotates in a first direction, the torque is transmitted to the coupling 32, first toothed wheel 33, and second toothed wheel 34 in turn. The second toothed wheel 34 rotates in a clockwise direction as viewed from above.

The torque of the drive shaft of the constant-speed motor 31 is transmitted from the second toothed wheel 34 to the third toothed wheel 35 and the fourth toothed wheel 36 in turn. Consequently, the one end of the rod 37 fixed to the fourth toothed wheel 36 is displaced away from the linear guide 39 concomitantly with clockwise rotation of the second toothed wheel 34. The rod 37 rotates together with the fourth toothed wheel 36 in a clockwise direction as viewed from above. As a result, the slider 38 coupled to the other end of the rod 37 moves toward the one end of the range of movement (i.e., toward the sample chamber 105) along the linear guide 39.

Then, the one end of the rod 37 is displaced into the position where the shortest distance to the linear guide 39 is greatest. The longitudinal direction of the rod 37 is brought substantially perpendicular to the linear guide 39 (the direction of movement of the slider 38) as shown in FIG. 7. At this time, the slider 38 (i.e., the holder mounting member 7) is located at the midpoint of the range of movement.

When the torque of the drive shaft of the constant-speed motor 31 is transmitted to the toothed wheels 33-36, the one end of the rod 37 is displaced concomitantly with clockwise rotation of the second toothed wheel 34 and approaches the linear guide 39. Also, the rod 37 rotates together with the fourth toothed wheel 36 in a clockwise direction as viewed from above. As a result, the slider 38 coupled to the other end of the rod 37 is placed at one end of the range of movement along the linear guide 39. At this time, the switch actuator 41 (see FIG. 6) pushes against the detection switch 42, whereby the slider 38 (i.e., the holder mounting member 7) is detected to be at one end of the range of movement.

When the slider 38 is placed at one end of the range of movement as shown in FIG. 8, the longitudinal direction of the rod 37 is nearly parallel to the linear guide 39, and the one end of the rod 37 (i.e., the fourth toothed wheel 36) is located close to the linear guide 39.

When detecting that the slider 38 (i.e., the holder mounting member 7) is placed at one end of the range of movement, the detection switch 42 transmits the result of the detection to the control circuit of the constant-speed motor 31. Based on the result of the detection by the detection switch 42, the control circuit stops the operation of the drive shaft of the constant-speed motor 31 in the first rotational direction and then starts to drive the drive shaft of the motor 31 in a second rotational direction opposite to the first rotational direction. When the drive shaft of the constant-speed motor 31 rotates in the second rotational direction, the torque is transmitted to the coupling 32, the first toothed wheel 33, and the second toothed wheel 34 in turn. The second toothed wheel 34 rotates in a counterclockwise direction as viewed from above.

The torque of the drive shaft of the constant-speed motor 31 is transmitted from the second toothed wheel 34 to the third toothed wheel 35 and the fourth toothed wheel 36 in turn. Consequently, as the second toothed wheel 34 rotates in a counterclockwise direction, the one end of the rod 37 fixedly secured to the fourth toothed wheel 36 is displaced away from the linear guide 39 and then approaches the linear guide 39. As a result, the slider 38 coupled to the other end of the rod 37 is placed at the other end of the range of movement along the linear guide 39.

As the slider 38 (i.e., the holder mounting member 7) approaches either end of the range of movement, the transport portion 8 of this construction reduces the amount of displacement of the one end of the rod 37 in the direction along the linear guide 39. Accordingly, the moving speed of the slider 38 (i.e., the holder mounting member 7) decreases with approaching either end of the range of movement. Therefore, when the sample holder 6 mounted to the holder mounting member 7 is placed on the support stage 108 of the sample chamber 105, the moving speed of the holder mounting member 7 can be lowered and thus damage to the support stage 108 can be prevented.

There may be provided an additional detection switch which is depressed by the switch actuator 41 when the holder mounting member 7 is placed at the other end of the range of movement. In this case, the constant-speed motor 31 is stopped from being driven according to the result of the detection by the detection switch. Consequently, the sample holder 6 mounted to the holder mounting member 7 comes to a halt while placed in the sample exchange chamber 4.

Holder Mounting Member

Figure 9:
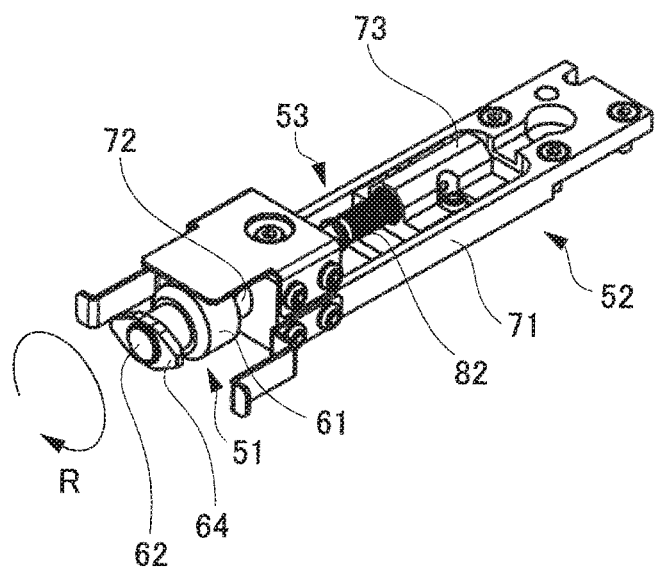
FIG. 9 is a perspective view of the holder mounting member of the sample carrier of FIGS. 7 and 8.
Figure 10:
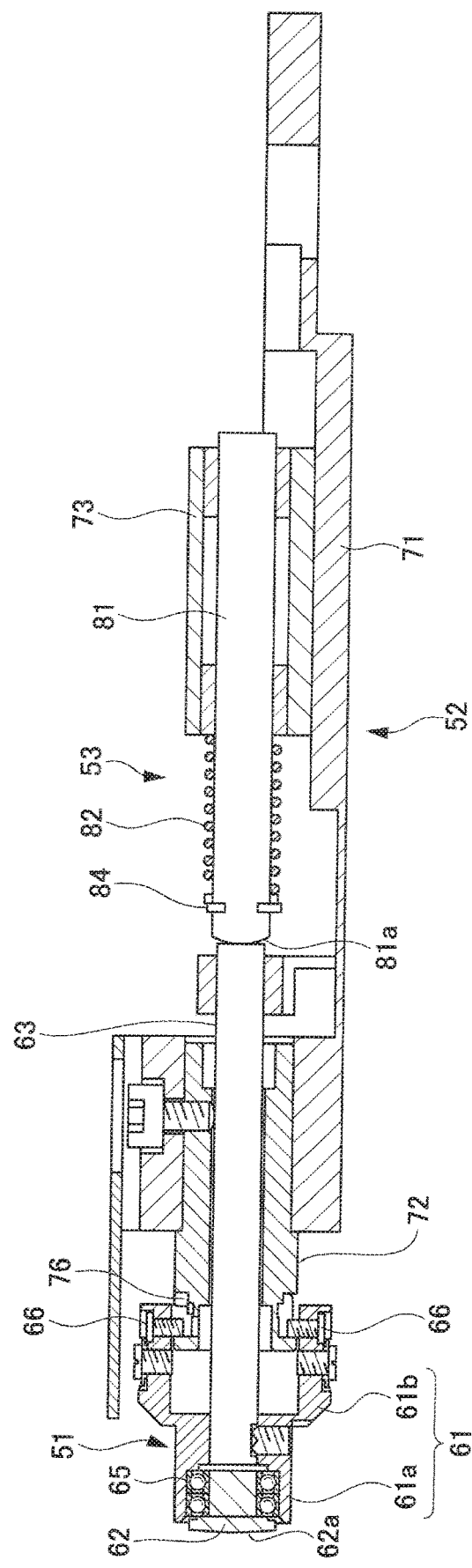
FIG. 10 is a vertical cross-sectional view of the holder mounting member of the sample carrier of FIGS. 7-9.
Figure 11:
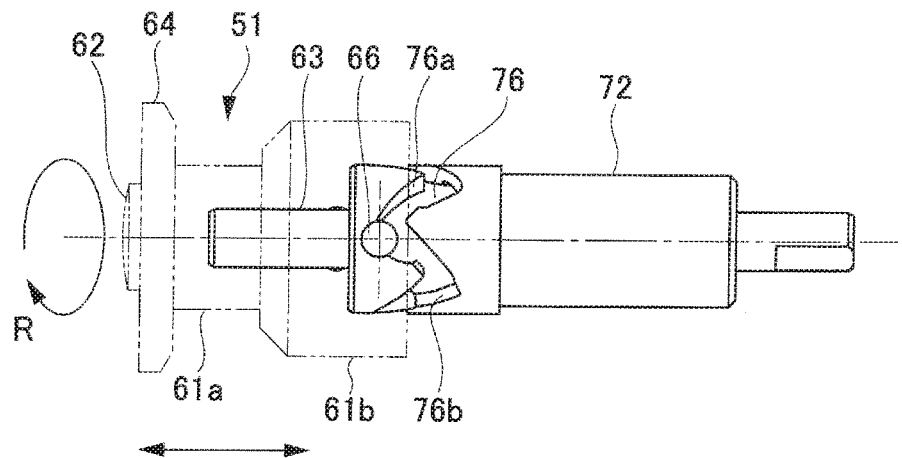
FIG. 11 is an explanatory view of cam pins and a cam groove of the holder mounting member of the sample carrier of FIGS. 7-10.

The configuration of the holder mounting member 7 is next described by referring to FIGS. 9-11. FIG. 9 is a perspective view of the holder mounting member 7. FIG. 10 is a vertical cross-sectional view of the holder mounting member 7. FIG. 11 is an explanatory view of cam pins and a cam groove of the holder mounting member 7.

As shown in FIGS. 9 and 10, the holder mounting member 7 has a connective portion 51, a base portion 52, and a biasing portion 53. The connective portion 51 has a connective portion body 61, a front-end pin 62 rotatably connected to the connective portion body 61, and a shaft 63 rigidly fixed to the connective portion body 61.

The connective portion body 61 has a front-end cylinder 61a and a rear-end cylinder 61b that has an inside diameter and an outside diameter greater than those of the front-end cylinder 61a. The front-end cylinder 61a and the rear-end cylinder 61b are shaped to be axially continuous with each other. A flange 64 (see FIG. 9) is formed around the outer periphery of the front-end cylinder 61a.

The flange 64 is an engagement piece of the holder mounting member associated with the present invention. The flange 64 is brought into engagement with the engagement groove 22 of the sample holder 6. The flange 64 is shaped like a substantially rectangular plate extending radially of the front-end cylinder 61a. The longitudinal length of the flange 64 is greater than the width of the opening 22a in the engagement groove 22. The lateral length of the flange 64 is smaller than the width of the opening 22a in the engagement groove 22.

In the engagement groove 22, if the longitudinal direction of the flange 64 is made to intersect the vertical direction, the flange 64 comes into engagement with the engagement groove 22. Furthermore, in the engagement groove 22, if the longitudinal direction of the flange 64 is made substantially parallel to the vertical direction, the flange 64 assumes a posture where it comes out of the engagement groove 22. The connective portion 51 is rotated to an engagement position where the flange 64 is in engagement with the engagement groove 22 and to a non-engagement position where the flange 64 is out of engagement with the engagement groove 22.

The front-end pin 62 is rotatably connected via a bearing 65 to the end of the front-end cylinder 61a on the opposite side from the rear-end cylinder 61b. The front-end pin 62 includes a head portion having a contact surface 62a which comes into contact with the bottom surface 22b of the engagement groove 22 formed in the sample holder 6. The contact surface 62a is shaped in the form of a curved surface.

The front-end cylinder 61a has an inside diameter portion to which the shaft 63 is fixedly secured with screws or other fastening means. The shaft 63 is shaped cylindrically and protrudes from the end of the rear-end cylinder 61b on the opposite side of the front-end cylinder 61a. The portion of the shaft 63 protruding from the rear-end cylinder 61b is slidably held to a first shaft-receiving portion 72 (described later) of the base portion 52.

Two cylindrical cam pins 66 are mounted to the rear-end cylinder 61b of the connective portion body 61. The two cam pins 66 extend through the rear-end cylinder 61b and protrude inside of the rear-end cylinder 61b. The portions of the two cam pins 66 protruding inside of the rear-end cylinder 61b engage a cam groove 76 (described later) in the base portion 52.

The base portion 52 has a base portion body 71, the aforementioned first shaft-receiving portion 72, and a second shaft-receiving portion 73. The base portion body 71 is shaped in the form of a substantially rectangular plate. The first shaft-receiving portion 72 is rigidly fixed to one longitudinal end of the base portion body 71 with screws or other fastening means. The other longitudinal end of the base portion body 71 is rigidly fixed to the slider 38 (see FIG. 6) of the transport portion 8 with screws or other fastening means.

The first shaft-receiving portion 72 is hollow and shaped cylindrically and has an inside diameter greater than the diameter of the shaft 63 in the connective portion 51. The shaft 63 extends through the inside diameter portion (cylindrical hole) of the first shaft-receiving portion 72. Consequently, the first shaft-receiving portion 72 supports the shaft 63 in such a way that the shaft 63 can rotate about its axis and move axially.

The first shaft-receiving portion 72 has an outside diameter smaller than the inside diameter of the rear-end cylinder 61b in the connective portion 51. The first shaft-receiving portion 72 has one axial end portion inserted in the rear-end cylinder 61b. As shown in FIG. 11, the cam groove 76 of peripherally continuous waveform is formed in the outer peripheral surface of the first shaft-receiving portion 72 at its one axial end.

When the first shaft-receiving portion 72 (base portion 52) moves relative to the connective portion 51 axially thereof, the cam pins 66 of the connective portion 51 are guided into the cam groove 76. When the cam pins 66 of the connective portion 51 are guided from the top to bottom or vice versa of the cam groove 76, the connective portion 51 rotates through about 45 degrees about the axis of the shaft 63.

The cam groove 76 has groove walls 76a and 76b which are opposite to each other axially of the first shaft-receiving portion 72. The groove wall 76a is formed on one axial end side of the first shaft-receiving portion 72 (on the side of the sample holder 6). The groove wall 76b is formed on the other axial end side of the first shaft-receiving portion 72 (on the side of the slider 38).

The groove walls 76a and 76b of the cam groove 76 are shaped wavily and out of phase with respect to each other. The amount of the phase deviation is set greater than the radius of the cam pins 66. Consequently, when the first shaft-receiving portion 72 (i.e., the base portion 52) moves relative to the connective portion 51 axially thereof, the direction in which the cam groove 76 guides the cam pins 66 can be maintained unchanged at all times. As a result, the connective portion 51 rotates in increments of about 45 degrees in the rotational direction R that is a constant direction about the axis of the first shaft-receiving portion 72.

The second shaft-receiving portion 73 is mounted midway in the longitudinal direction of the base portion body 71. The second shaft-receiving portion 73 supports a biasing shaft 81 (described later) of the biasing portion 53 such that the shaft 81 can rotate about its axis and move axially.

As shown in FIG. 10, the biasing portion 53 has the biasing shaft 81 and a compression coil spring 82. As described previously, the biasing shaft 81 is supported to the second shaft-receiving portion 73. One axial end of the biasing shaft 81 is in contact with the shaft 63 of the connective portion 51. The biasing shaft 81 has a contact surface 81a that makes contact with the shaft 63, the contact surface 81a being shaped in the form of a curved surface.

A spring engagement piece 84 against which one end of the compression coil spring 82 abuts is formed on the biasing shaft 81. The other end of the compression coil spring 82 abuts on the end surface of the second shaft-receiving portion 73. When the cam pins 66 of the connective portion 51 reside in the valley of the groove wall 76a of the cam groove 76 of the first shaft-receiving portion 72 as shown in FIG. 11, the distance between the connective portion 51 and the second shaft-receiving portion 73 is a given distance. Under this condition, the compression coil spring 82 is not compressed.

On the other hand, when the cam pins 66 of the connective portion 51 are guided from the valley of the groove wall 76a in the cam groove 76 of the first shaft-receiving portion 72 toward the groove wall 76b, the connective portion 51 moves toward the second shaft-receiving portion 73 in the axial direction while rotating in the rotational direction R. Consequently, the compression coil spring 82 is compressed, and the connective portion 51 is biased away from the second shaft-receiving portion 73, i.e., toward the sample holder 6.

When the cam pins 66 of the connective portion 51 reach the valley of the groove wall 76b in the cam groove 76 of the first shaft-receiving portion 72, the rotation and movement of the connective portion 51 come to a halt. Also, the compression coil spring 82 is no longer compressed. Accordingly, if the cam pins 66 of the connective portion 51 reside in the valley of the groove wall 76b in the cam groove 76 of the first shaft-receiving portion 72, the biasing force of the biasing portion 53 is greatest.

Operation of Sample Carrier

Figure 12:
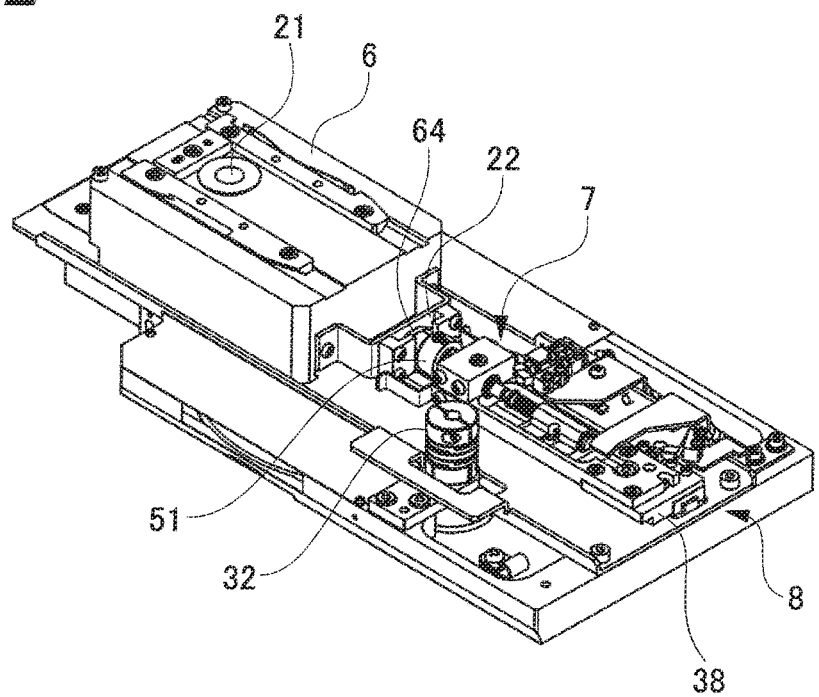
FIG. 12 is an explanatory view illustrating a state in which the holder mounting member has been mounted on a sample holder disposed in a sample exchange chamber of the sample carrier of FIGS. 1-5.
Figure 14:
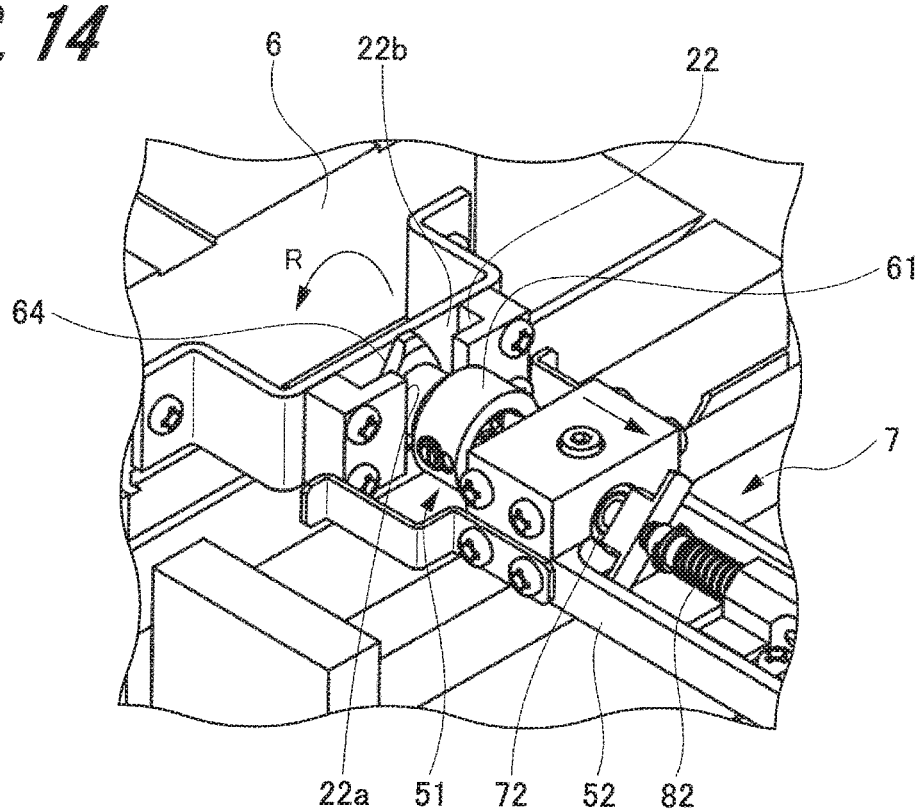
FIG. 14 is an explanatory view illustrating a state in which the sample holder of the sample carrier has been placed on the support stage and the holder mounting member has been removed.
Figure 15:
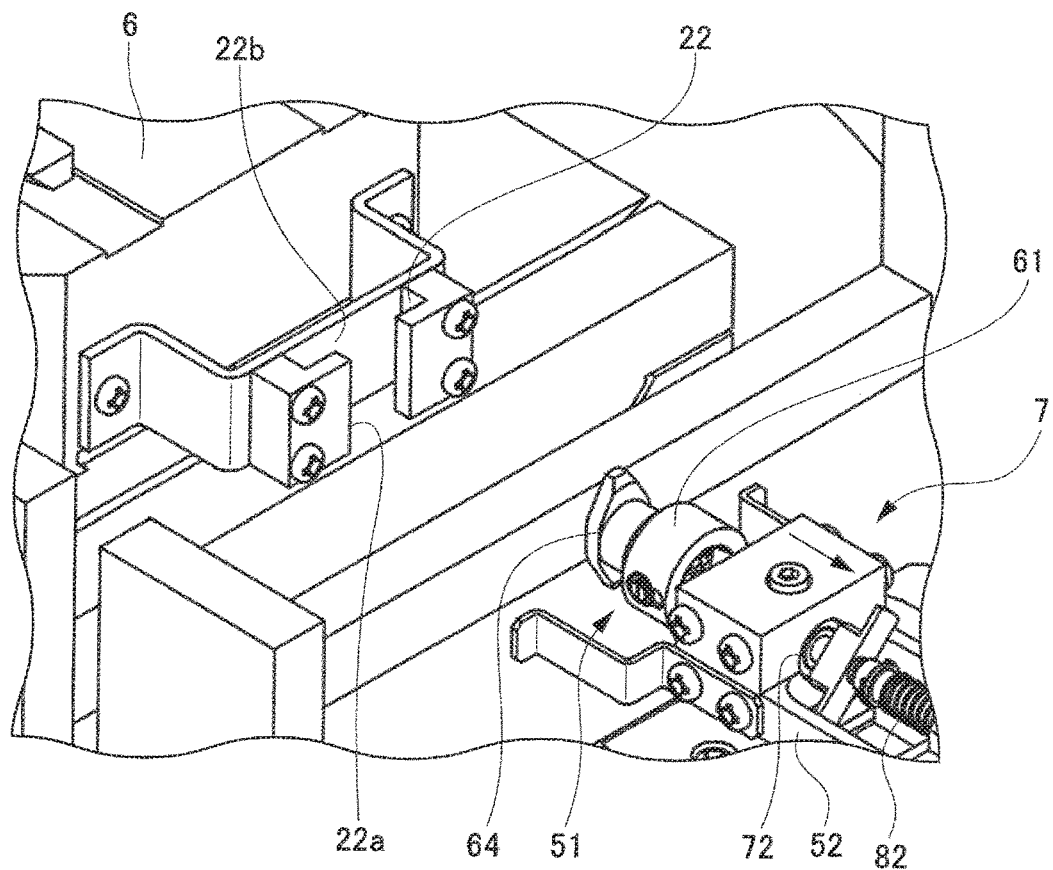
FIG. 15 is an explanatory view illustrating a state in which the holder mounting member has been brought close to the sample holder disposed on the support stage of FIGS. 13 and 14.
Figure 16:
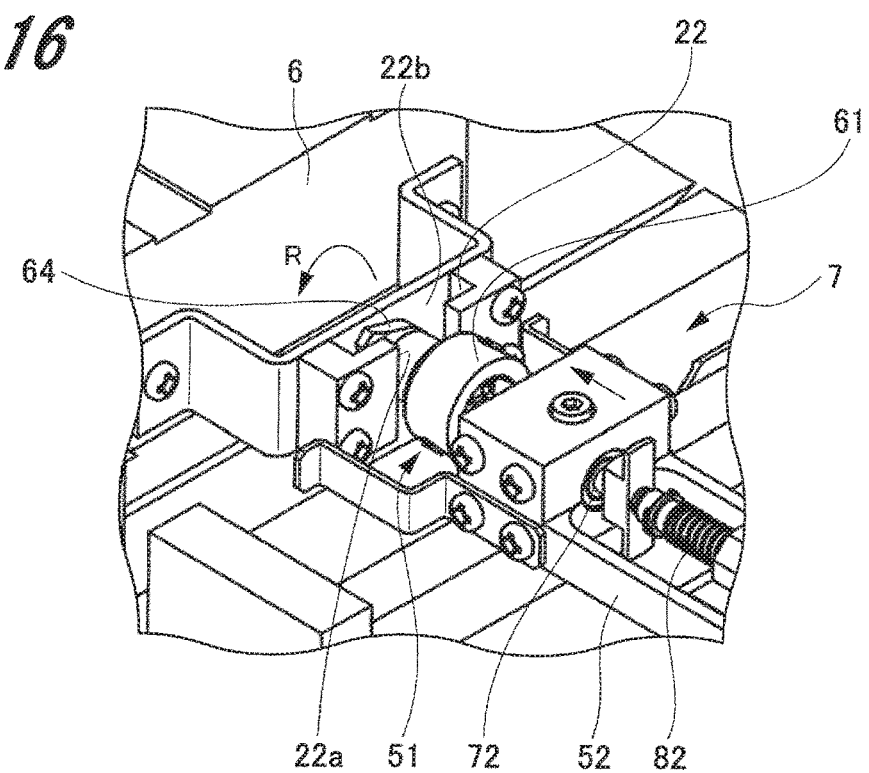
FIG. 16 is an explanatory view illustrating a state in which the holder mounting member has been pressed against the sample holder that is disposed on the support stage.
Figure 17:
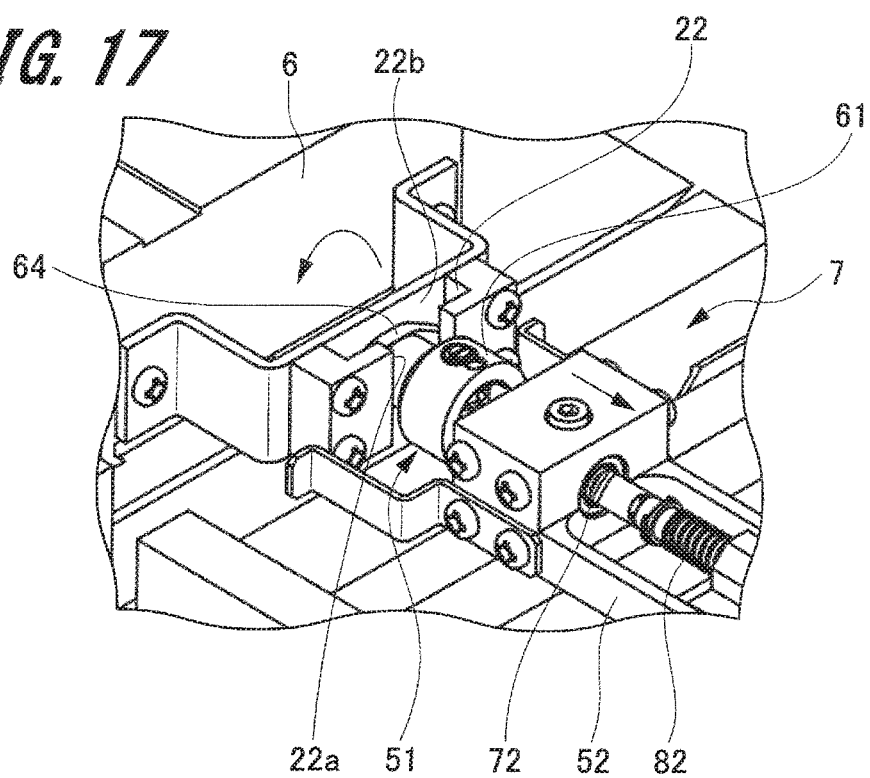
FIG. 17 is an explanatory view illustrating a state in which the holder mounting member has been mounted on the sample holder that is disposed on the support stage.

The operation of the sample carrier 1 is next described by referring to FIGS. 12-17. FIG. 12 is a perspective view showing a state in which the holder mounting member 7 has been mounted to the sample holder 6 disposed in the sample exchange chamber. FIG. 13 is an explanatory view showing the holder mounting member 7 that is carrying the sample holder 6 to the support stage. FIG. 14 is an explanatory view showing a state in which the sample holder 6 is disposed on the support stage and the holder mounting member 7 is detached. FIG. 15 is an explanatory view showing a state in which the holder mounting member 7 has been brought close to the sample holder 6 disposed on the support stage. FIG. 16 is an explanatory view showing a state in which the holder mounting member 7 has been pressed against the sample holder 6 that is disposed on the support stage. FIG. 17 is an explanatory view showing a state in which the holder mounting member 7 has been mounted to the sample holder 6 that is disposed on the support stage.

In order to carry the sample holder 6 having the sample 106 thereon to the support stage 108 (see FIG. 2) of the sample chamber 105, the valve assembly 11 is first closed to close off the communication between the sample chamber 105 and the sample exchange chamber 4. The interior of the sample exchange chamber 4 is placed at atmospheric pressure.

Then, the sample holder 6 is inserted into the sample exchange chamber 4 through the exchange window 4a, and the flange 64 of the holder mounting member 7 is brought into engagement with the engagement groove 22 of the sample holder 6 as shown in FIG. 12. At this time, the connective portion 51 is disposed at the engagement position, and the longitudinal direction of the flange 64 is parallel to the horizontal direction.

The exchange window 4a of the sample exchange chamber 4 is then closed by an exchange cover (not shown). The sample exchange chamber 4 is evacuated using the vacuum pump 16 and then the valve assembly 11 is opened. This makes communication between the sample chamber 105 and the sample exchange chamber 4. The sample holder 6 can be carried to the support stage 108 in the sample chamber 105.

Then, the transport portion 8 is driven. In particular, the drive shaft of the constant-speed motor 31 is rotated in the first direction. Consequently, the torque of the drive shaft of the constant-speed motor 31 is transmitted to the toothed wheels 33-36 and the rod 37 in turn. The slider 38 coupled to the rod 37 and the holder mounting member 7 fixed to the slider 38 move along the linear guide 39 toward the sample chamber 105.

When the holder mounting member 7 moves toward the sample chamber 105, the front-end pin 62 of the holder mounting member 7 comes into contact with the bottom surface 22b of the engagement groove 22 in the sample holder 6, pressing the connective portion 51 against the sample holder 6. At this time, frictional force is produced between the sample holder 6 and the holder guide 15 on which the holder 6 slides and so the sample holder 6 does not move if pressed by the connective portion 51. The frictional force may be hereinafter referred to as the frictional force on the sample holder 6.

On the other hand, the base portion 52 of the holder mounting member 7 moves toward the sample chamber 105 and, therefore, the first shaft-receiving portion 72 (i.e., the base portion 52) moves relative to the connective portion 51 axially thereof. That is, the first shaft-receiving portion 72 enters the rear-end cylinder 6b of the connective portion 51. Because the first shaft-receiving portion 72 (i.e., the base portion 52) moves relative to the connective portion 51, the compression coil spring 82 is compressed.

When the first shaft-receiving portion 72 (i.e., the base portion 52) moves toward the sample chamber 105, the cam pins 66 mounted to the connective portion 51 are guided into the cam groove 76 formed in the first shaft-receiving portion 72. More specifically, the cam pins 66 are guided from the valley of the groove wall 76a in the cam groove 76 to the valley of the groove wall 76b. As a result, the connective portion 51 rotates through about 45 degrees in the rotational direction R as shown in FIG. 13. At this time, the connective portion 51 (i.e., the connective portion body 61) is in contact with the sample holder 6 via the front-end pin 62 rotatably connected using the bearing 65 and so the connective portion 51 can rotate smoothly.

Because the connective portion 51 rotates through about 45 degrees in the rotational direction R, the longitudinal direction of the flange 64 tilts through about 45 degrees relative to the horizontal direction. Even under this condition, the flange 64 stays in engagement with the engagement groove 22. That is, the connective portion 51 is disposed at the engagement position.

When the cam pins 66 engage the valley of the groove wall 76b in the cam groove 76, movement of the first shaft-receiving portion 72 (i.e., the base portion 52) relative to the connective portion 51 is brought to a stop, so that the connective portion 51 and the first shaft-receiving portion 72 (i.e., the base portion 52) move together. As a result, the pushing force of the holder mounting member 7 on the sample holder 6 becomes greater than the frictional force on the sample holder 6. The sample holder 6 moves towards the support stage 108 of the sample chamber 105. During this movement, the compression coil spring 82 of the holder mounting member 7 is kept in compression.

After carrying the sample holder 6 to the support stage 108 of the sample chamber 105, the drive shaft of the constant-speed motor 31 is stopped and then rotated in the second direction. In consequence, the holder mounting member 7 securely fixed to the slider 38 moves along the linear guide 39 to the opposite side of the sample chamber 105.

At this time, the connective portion 51 is biased by the spring force of the compression coil spring 82 and pressed against the bottom surface 22b of the sample holder 6 and so does not move to the opposite side of the sample chamber 105. Consequently, the first shaft-receiving portion 72 (i.e., the base portion 52) moves relative to the connective portion 51 axially of the connective portion 51. That is, the first shaft-receiving portion 72 moves away from the rear-end cylinder 61b of the connective portion 51. Then, the compression coil spring 82 is gradually decompressed.

When the first shaft-receiving portion 72 moves to the opposite side of the sample chamber 105, the cam pins 66 mounted to the connective portion 51 are guided into the cam groove 76 formed in the first shaft-receiving portion 72. In particular, the cam pins 66 are guided from the valley of the groove wall 76b in the cam groove 76 to the valley of the groove wall 76a. As a result, the connective portion 51 rotates through about 45 degrees in the rotational direction R as shown in FIG. 14. At this time, the connective portion 51 (i.e., the connective portion body 61) is in contact with the sample holder 6 via the front-end pin 62 and so can rotate smoothly.

Furthermore, because the connective portion 51 rotates through about 45 degrees in the rotational direction R, the longitudinal direction of the flange 64 becomes substantially parallel to the vertical direction. Under this condition, the flange 64 is out of engagement with the engagement groove 22. That is, the connective portion 51 is placed in the non-engagement position. The moving speed of the slider 38 (i.e., the holder mounting member 7) decreases with approaching either end of the range of movement and so the flange 64 can be prevented from interfering with the engagement groove 22 before the connective portion 51 completes its rotation through about 45 degrees in the rotational direction R.

When the connective portion 51 rotates through about 45 degrees in the rotational direction R, the distance between the connective portion 51 and the second shaft-receiving portion 73 becomes equal to the given distance, so that the compression on the compression coil spring 82 is relieved. As a result, as shown in FIG. 15, the connective portion 51 and the first shaft-receiving portion 72 (i.e., the base portion 52) together move to the opposite side of the sample chamber 105. The holder mounting member 7 separates from the sample holder 6 and returns into the sample exchange chamber 4.

Then, in order to carry the sample holder 6 placed on the support stage 108 of the sample chamber 105 into the sample exchange chamber 4, the transport portion 8 is first driven to move the holder mounting member 7 disposed in the sample exchange chamber 4 to the side of the sample chamber 105. At this time, the longitudinal direction of the flange 64 is substantially parallel to the vertical direction. Therefore, the flange 64 of the holder mounting member 7 can pass through the opening 22a in the engagement groove 22 of the sample holder 6.

When the holder mounting member 7 moves to the side of the sample chamber 105, the flange 64 passes through the opening 22a of the engagement groove 22. The front-end pin 62 of the connective portion 51 comes into contact with the bottom surface 22b of the engagement groove 22 and thus the connective portion 51 pushes against the sample holder 6. At this time, frictional force is produced on the sample holder 6 and so the sample holder 6 does not move if pushed by the connective portion 51.

The base portion 52 of the holder mounting member 7 also moves to the side of the sample chamber and so the first shaft-receiving portion 72 (i.e., the base portion 52) moves relative to the connective portion 51 axially thereof. That is, the first shaft-receiving portion 72 enters the rear-end cylinder 61b of the connective portion 51. Since the first shaft-receiving portion 72 (i.e., the base portion 52) moves relative to the connective portion 51, the compression coil spring 82 is compressed.

When the first shaft-receiving portion 72 (i.e., the base portion 52) moves to the side of the sample chamber 105, the cam pins 66 mounted to the connective portion 51 are guided into the cam groove 76 formed in the first shaft-receiving portion 72. As a result, the connective portion 51 rotates through about 45 degrees in the rotational direction R as shown in FIG. 16. At this time, the connective portion 51 (i.e., the connective portion body 61) is in contact with the sample holder 6 via the front-end pin 62 and hence can rotate smoothly.

Because the connective portion 51 rotates through about 45 degrees in the rotational direction R, the longitudinal direction of the flange 64 tilts through about 45 degrees relative to the vertical direction. Under this condition, the flange 64 is in engagement with the engagement groove 22. That is, the connective portion 51 is placed at the engagement position.

When the cam pins 66 engage the valley of the groove wall 76b of the cam groove 76, the movement of the first shaft-receiving portion 72 (i.e., the base portion 52) relative to the connective portion 51 is brought to a stop. Because the holder mounting member 7 has moved to one end of the range of movement, the drive shaft of the constant-speed motor 31 is brought to a stop. Then, the shaft is rotated in the second direction. Consequently, the holder mounting member 7 rigidly fixed to the slider 38 moves along the linear guide 39 to the opposite side of the sample chamber 105.

At this time, the connective portion 51 is biased by the spring force of the compression coil spring 82 and pushed against the bottom surface 22b of the sample holder 6 and, therefore, the connective portion 51 does not move to the opposite side of the sample chamber 105. Thus, the first shaft-receiving portion 72 (i.e., the base portion 52) moves relative to the connective portion 51 axially thereof. That is, the first shaft-receiving portion 72 moves away from the rear-end cylinder 61*b* of the connective portion 51. The compression coil spring 82 is gradually decompressed.

When the first shaft-receiving portion 72 moves to the opposite side of the sample chamber 105, the cam pins 66 mounted to the connective portion 51 are guided into the cam groove 76 formed in the first shaft-receiving portion 72. As a result, the connective portion 51 rotates through about 45 degrees in the rotational direction R as shown in FIG. 17. At this time, the connective portion 51 (i.e., the connective portion body 61) is in contact with the sample holder 6 via the front-end pin 62 and thus can rotate smoothly.

Because the connective portion 51 rotates through about 45 degrees in the rotational direction R, the longitudinal direction of the flange 64 is substantially parallel to the horizontal direction. Under this condition, the flange 64 is in engagement with the engagement groove 22. That is, the connective portion 51 is placed in the engagement position. The moving speed of the slider 38 (i.e., the holder mounting member 7) decreases with approaching either end of the range of movement and so the flange 64 can be prevented from interfering with the engagement groove 22 before the connective portion 51 completes its rotation through about 45 degrees in the rotational direction R.

When the connective portion 51 rotates through about 45 degrees in the rotational direction R, the distance between the connective portion 51 and the second shaft-receiving portion 73 becomes equal to a given distance, so that the compression on the compression coil spring 82 is relieved. As a result, the connective portion 51 and the first shaft-receiving portion 72 (i.e., the base portion 52) move together to the opposite side of the sample chamber 105. The holder mounting member 7 to which the sample holder 6 is mounted returns into the sample exchange chamber 4.

Advantageous Effects of Embodiment

According to the embodiment described thus far, the transport portion 8 has the second toothed wheel 34 being one specific example of a rotary member, the linear guide 39 being one specific example of a guide portion, and the rod 37. The linear guide 39 guides the slider 38 (i.e., the holder mounting member 7) in a linear direction perpendicular to the axis of rotation of the second toothed wheel 34. The rod 37 is rotatably coupled to the second toothed wheel 34 and to the slider 38 (i.e., the holder mounting member 7). At the midpoint of the range of movement of the slider 38 (i.e., the holder mounting member 7), the shortest distance from the portion of the slider 38 coupled to the second toothed wheel 34 to the linear guide 39 is greatest.

Thus, as the slider 38 (i.e., the holder mounting member 7) approaches either end of the range of movement, the amount of displacement of the point of the rod 37 at which it is coupled to the second toothed wheel 34 in a direction along the linear guide 39 decreases. Consequently, the moving speed of the slider 38 (i.e., that of the holder mounting member 7) decreases with approaching either end of the range of movement. Hence, when the sample holder 6 mounted to the holder mounting member 7 is placed on the support stage 108 of the sample chamber 105, the moving speed of the holder mounting member 7 can be reduced without using a control system providing variable speeds and thus damage to the support stage 108 can be prevented.

A known sample carrier has an exchange rod to which a sample holder is mounted. The sample carrier is so designed that a human operator manipulates the exchange rod to carry the sample holder onto a support stage in a sample chamber. This known sample carrier needs a space of a length that is about twice the conveyance distance. This increases the footprint of the whole equipment. The present embodiment, however, provides the above-described transport portion 8 and can curtail the footprint of the whole equipment.

Furthermore, in the present embodiment, the cam groove 76 is shaped in waveform. The mutually opposite groove walls 76*a* and 76*b* are out of phase. Consequently, the flange 64 can be easily brought into and out of engagement with the engagement groove 22 by rotating the connective portion 51 in one direction (rotational direction R).

In addition, in the present embodiment, the connective portion 51 has the connective portion body 61 and the front-end pin 62 rotatably connected to the body 61 and coming into contact with the sample holder 6. Consequently, when the cam pins 66 are guided into the cam groove 76 while the front-pin 62 is in contact with the sample holder 6, the connective portion 51 (i.e., the connective portion body 61) can be rotated smoothly.

In addition, in the present embodiment, the switch actuator 41 (detected portion) is attached to the second toothed wheel 34 (rotary member). Furthermore, there is provided the detection switch 42 (detection portion) which, when pressed against the switch actuator 41, detects that the holder mounting member 7 is placed at one end (on the side of the sample chamber 105) of the range of movement. This facilitates achieving reciprocative conveyance of the holder mounting member 7 without controlling the rotational frequency of the drive shaft using a stepping motor.

Modified Embodiments

It is to be understood that the present invention is not restricted to the foregoing embodiment but rather can be practiced in various modified forms without departing from the gist and scope of the present invention as disclosed herein and claimed as appended herewith. For example, in the above embodiment, the cam pins 66 are mounted to the connective portion 51 of the holder mounting member 7, and the cam groove 76 is formed in the first shaft-receiving portion 72 (i.e., the base portion 52). The holder mounting member associated with the present invention may also be so designed that the cam pins are mounted to the first shaft-receiving portion (base portion) and that the cam groove is formed in the connective portion.

Additionally, in the above embodiment, the detection portion is made of the detection switch 42 for detecting a physical contact. The detection portion associated with the present invention may also be made of various types of detectors such as photosensor and infrared sensor. Further, in the above embodiment, the switch actuator 41 acting as a detected portion is attached to the second toothed wheel 34. The detected portion associated with the present invention can be attached at a position that can be appropriately set. For example, the detected portion may be mounted to the holder mounting member 7.

Still further, in the above embodiment, the biasing portion 53 has the compression coil spring 82. The biasing portion associated with the present invention may also be only required to bias the connective portion to the sample holder side. For example, a leaf spring, a tensile coil spring, or other spring member may be used as the biasing portion. Additionally, a member having resilience such as sponge or rubber may be used.

Yet further, in the above embodiment, the holder mounting member 7 is rigidly fixed to the slider 38 that is slidably engaged to the linear guide 39. The holder mounting member associated with the present invention may be slidably engaged to the linear guide without via a slider. In this case, the rod is rotatably coupled to the second toothed wheel (rotary member) and to the holder mounting member.

The invention claimed is:

1. A sample carrier comprising:
   a sample holder for holding a sample;
   a holder mounting member configured to be capable of being attached and detached to and from the sample holder and having a range of movement; and
   a transport portion for causing the holder mounting member to move rectilinearly;
   wherein said transport portion has a drive source, a rotary member rotated about its axis of rotation by the drive source, a guide portion for guiding the holder mounting member in a linear direction perpendicular to the axis of rotation of the rotary member, and a rod rotatably coupled to the rotary member and to the holder mounting member, the rod having a coupled portion coupled to the rotary member;
   wherein at a midpoint of a range of movement of the holder mounting member, a shortest distance from said coupled portion of the rod to said guide portion is greatest, said holder mounting member having a cylindrically shaped connective portion, a base portion fitted over the connective portion, and a biasing portion for biasing the connective portion toward the sample holder;
   wherein the connective portion has an outer peripheral portion on which an engagement piece is mounted, the connective portion being supported by the base portion so as to be rotatable about its axis and movable axially, one of the base portion and the connective portion having a cam groove, the other having cam pins that engage the cam groove; and
   wherein when the base portion moves relative to the connective portion axially of the connective portion, the cam pins and the cam groove cooperate to rotate the connective portion through a given angle in one rotational direction, whereby the engagement piece is placed either in an engagement position where the engagement piece engages the sample holder or a non-engagement position where the engagement piece disengages from the sample holder.

2. A sample carrier as set forth in claim 1, wherein said cam groove is shaped in a waveform and has mutually opposite groove walls which are out of phase.

3. A sample carrier as set forth in claim 1, wherein said connective portion has a connective portion body over which said base portion fits and a front-end pin rotatably connected to the connective portion body and in contact with the sample holder.

4. A sample carrier as set forth in claim 1, further comprising:
   a detected portion mounted to said rotary member of said transport portion; and
   a detection portion for detecting that said holder mounting member is placed at one end of the range of movement by detecting the detected portion.

5. An electron microscope having an electron beam irradiation portion for irradiating a sample with an electron beam, an electron detection device for detecting electrons emanating from the sample in response to the electron beam irradiation, and a sample carrier for transporting the sample into a position hit by the electron beam, said sample carrier comprising:
   a sample holder for holding the sample;
   a holder mounting member configured to be capable of being attached and detached to and from the sample holder and having a range of movement; and
   a transport portion for causing the holder mounting member to move rectilinearly;
   wherein said transport portion has a drive source, a rotary member rotated about its axis of rotation by the drive source, a guide portion for guiding the holder mounting member in a linear direction perpendicular to the axis of rotation of the rotary member, and a rod rotatably coupled to the rotary member and to the holder mounting member, the rod having a coupled portion coupled to the rotary member;
   wherein at a midpoint of a range of movement of the holder mounting member, a shortest distance from said coupled portion of the rod to said guide portion is greatest, said holder mounting member having a cylindrically shaped connective portion, a base portion fitted over the connective portion, and a biasing portion for biasing the connective portion toward the sample holder;
   wherein the connective portion has an outer peripheral portion on which an engagement piece is mounted, the connective portion being supported by the base portion so as to be rotatable about its axis and movable axially, one of the base portion and the connective portion having a cam groove, the other having cam pins that engage the cam groove; and
   wherein when the base portion moves relative to the connective portion axially of the connective portion, the cam pins and the cam groove cooperate to rotate the connective portion through a given angle in one rotational direction, whereby the engagement piece is placed either in an engagement position where the engagement piece engages the sample holder or a non-engagement position where the engagement piece disengages from the sample holder.

* * * * *